United States Patent
Chiang et al.

(10) Patent No.: US 12,402,327 B2
(45) Date of Patent: Aug. 26, 2025

(54) MEMORY DEVICES AND METHODS OF FORMING THE SAME

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Tzu-Chiang Chen, Hsinchu (TW); Meng-Fan Chang, Taichung (TW)

(73) Assignee: Taiwan Semiconductor Manufaturing Company, Ltd., Hsinchu (TW)

( * ) Notice: Subject to any disclaimer, the term of this patent is extended or adjusted under 35 U.S.C. 154(b) by 630 days.

(21) Appl. No.: 17/574,549

(22) Filed: Jan. 13, 2022

(65) Prior Publication Data

US 2023/0225218 A1  Jul. 13, 2023

(51) Int. Cl.
*H10B 61/00* (2023.01)
*H10N 50/01* (2023.01)
*H10N 50/10* (2023.01)
*H10N 50/80* (2023.01)

(52) U.S. Cl.
CPC ............ *H10B 61/22* (2023.02); *H10N 50/01* (2023.02); *H10N 50/10* (2023.02); *H10N 50/80* (2023.02)

(58) Field of Classification Search
CPC ......... H10B 61/22; H10N 50/10; H10N 50/80
See application file for complete search history.

(56) References Cited

U.S. PATENT DOCUMENTS

| | | | | |
|---|---|---|---|---|
| 6,104,632 A | * | 8/2000 | Nishimura | H10B 61/22 365/158 |
| 8,760,914 B2 | * | 6/2014 | Keshtbod | G11C 11/1673 365/158 |
| 2002/0149962 A1 | * | 10/2002 | Horiguchi | H10B 61/22 365/173 |
| 2004/0047190 A1 | * | 3/2004 | Odagawa | H10B 61/22 365/200 |
| 2004/0057276 A1 | * | 3/2004 | Nejad | H10B 61/22 365/158 |
| 2009/0174016 A1 | * | 7/2009 | Tanizaki | H10B 61/22 257/421 |
| 2012/0134200 A1 | * | 5/2012 | Khoueir | H10B 61/22 365/158 |
| 2018/0358542 A1 | * | 12/2018 | Mihajlovic | H10B 61/22 |
| 2022/0285610 A1 | * | 9/2022 | Zhao | H10B 61/00 |

FOREIGN PATENT DOCUMENTS

| | | | | | |
|---|---|---|---|---|---|
| CN | 110164902 A | * | 8/2019 | | H10B 61/00 |
| KR | 20050001022 A | * | 1/2005 | | H10N 50/10 |

* cited by examiner

*Primary Examiner* — Peter M Albrecht
(74) *Attorney, Agent, or Firm* — JCIPRNET

(57) ABSTRACT

A memory device includes a transistor and a memory cell. The transistor includes a gate electrode disposed over a substrate and source/drain regions in the substrate beside the gate electrode. The memory cell is disposed over the transistor and includes a bottom electrode electrically connected to one of the source/drain regions, a top electrode disposed over the bottom electrode, and a first bit and a second bit separated from each other and disposed between the bottom electrode and the top electrode.

20 Claims, 15 Drawing Sheets

MEMORY DEVICES AND METHODS OF FORMING THE SAME

BACKGROUND

Memory devices are used in integrated circuits for electronic applications, including radios, televisions, cell phones, and personal computing devices, as examples. Various techniques are being used in the semiconductor industry to increase the storage density of memory devices. Although the existing memory devices have generally been adequate for their intended purposes, as device scaling-down continues, they have not been entirely satisfactory in all respects. For examples, a multi-bit memory cell has been drawn high attention in the industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
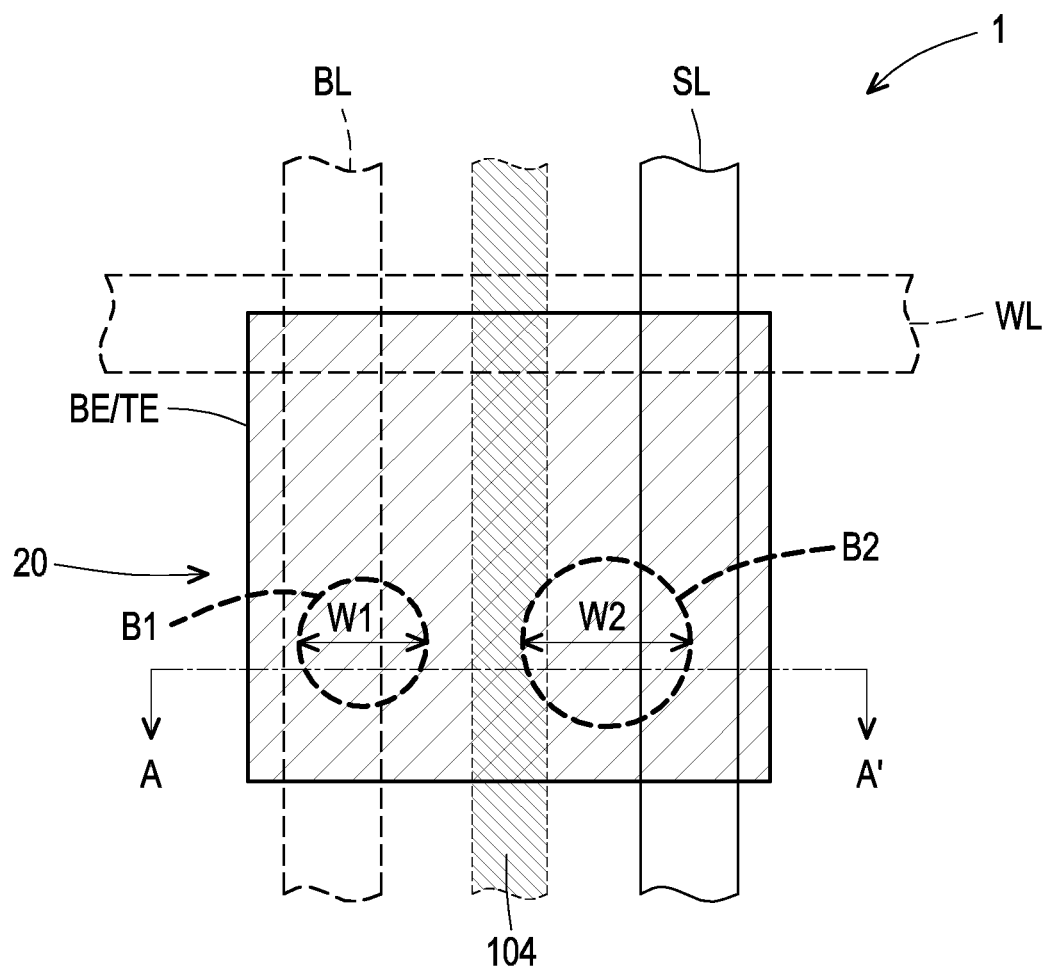
FIG. 1 is a schematic simplified top view of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The conventional memory device includes a single-bit memory cell controlled by one transistor. One of the conventional architectures is the so-called one transistor-one magnetic tunnel junction per cell ("1T-1MTJ") architecture. However, such 1T-1MTJ memory device is not suitable for a multi-level cell (MLC) application as the device scaling-down continues. In some embodiment of the disclosure, a multi-bit memory cell controlled by a single transistor is provided, so as to reduce the total size of the memory cell and therefore save the footprint area and the production cost.

Figure 2:
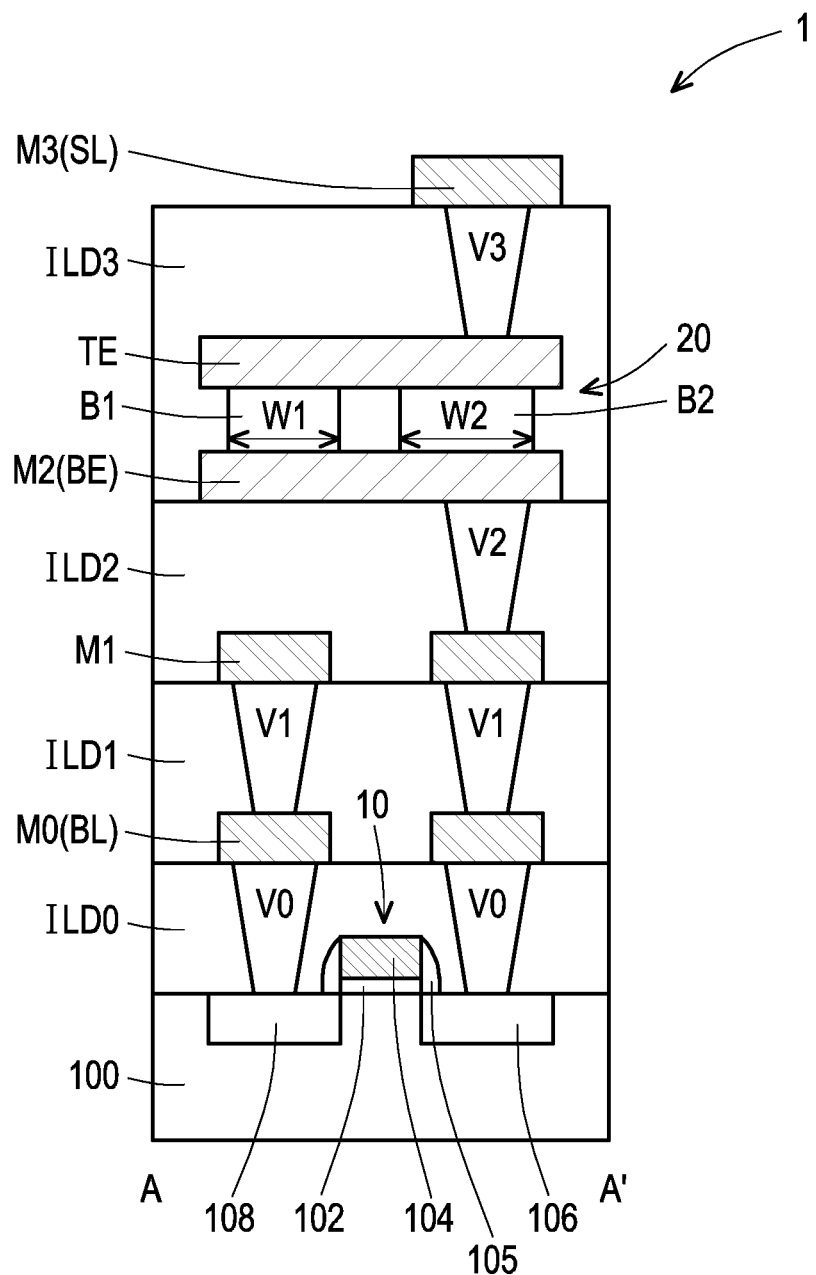
FIG. 2 is a schematic cross-sectional view taken along the line A-A' of FIG. 1.
Figure 3:
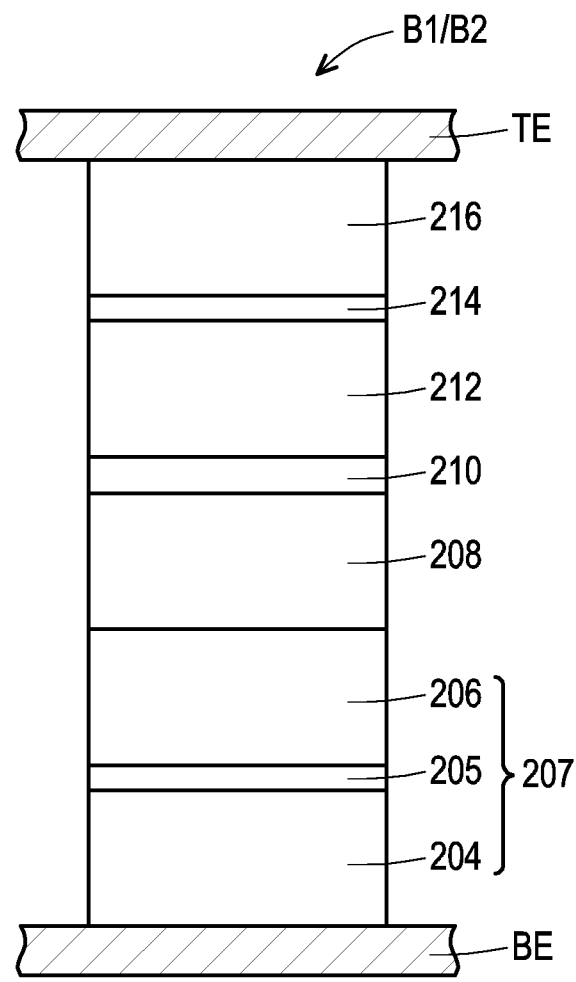
FIG. 3 is a schematic cross-sectional view of a bit structure in accordance with some embodiments.

FIG. 1 is a schematic simplified top view of a memory device in accordance with some embodiments. FIG. 2 is a schematic cross-sectional view taken along the line A-A' of FIG. 1. FIG. 3 is a schematic programming scheme of a memory device in accordance with some embodiments.

Referring to FIG. 1 and FIG. 2, a memory device 1 includes a transistor 10 and a memory cell 20. The memory cell 20 is a multi-bit memory cell (e.g., two-bit memory cell) controlled by a single transistor 10.

In some embodiments, the transistor 10 is disposed in a cell region of the substrate 100. In some embodiments, the substrate 100 includes silicon and/or elementary semiconductor such as germanium. Alternatively or additionally, the substrate may include a compound semiconductor such as silicon carbide, gallium arsenide, indium arsenide, and/or indium phosphide. In some embodiments, the substrate 100 may include a silicon-on-insulator (SOI) structure. The substrate 100 may also include various doping configurations depending on design requirements as is known in the art such as P-type substrate and/or N-type substrate and various doped regions such as P-wells and/or N-wells.

In some embodiments, the transistor 10 may be a lateral transistor, a vertical transistor or a suitable semiconductor device, like a bipolar device. The transistor is a FinFET device, a tunnel FET ("TFET") device, a gate-all-around ("GAA") device or a suitable device depending on the memory circuitry design.

In some embodiments, the transistor 10 includes a gate dielectric layer 102, a gate electrode 104 over the gate dielectric layer 102, and a spacer 105 aside the gate electrode 104.

The gate dielectric layer 102 may include a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In other embodiments, the gate dielectric layer 102 can optionally include a silicate such as HfSiO, LaSiO, AlSiO, the like, or a combination thereof.

The gate electrode 104 may include a metal material suitable for forming a metal gate or portion thereof. In some embodiments, the gate electrode 104 includes a work function metal layer and a fill metal layer on the work function metal layer. The work function metal layer is an N-type work function metal layer and/or a P-type work function metal layer. In some embodiments, the N-type work function metal layer includes TiAl, TiAlN, or TaCN, conductive metal oxide, and/or a suitable material. In other embodiments, the P-type work function metal layer includes TiN, WN, TaN, conductive metal oxide, and/or a suitable material. The fill metal layer includes copper, aluminum, tungsten, or a suitable material. In some embodiments, the gate electrode 104 is electrically connected to a word line WL.

The spacer 105 may include a nitrogen-containing dielectric material, a carbon-containing dielectric material or both, and the spacer 105 has a dielectric constant less than about 10, or even less than about 5. In some embodiments, the spacer 105 include SiN, SiCN, SiOCN, SiOR (wherein R is an alkyl group such as $CH_3$, $C_2H_5$ or $C_3H_7$), SiC, SiOC, SiON, the like, or a combination thereof.

In some embodiments, the transistor 10 further includes two source/drain regions 106 and 108 in the substrate 100 beside the gate electrode 104. In some embodiments, the source/drain region 106 functions as a source region, and the source/drain region 108 functions as a drain region.

In some embodiments, each of the source/drain regions 106 and 108 includes silicon germanium (SiGe) for a P-type device. In other embodiments, each of the source/drain regions 106 and 108 includes silicon carbon (SiC), silicon phosphate (SiP), SiCP or a SiC/SiP multi-layer structure for an N-type device. In some embodiments, the source/drain regions 106 and 108 may be optionally implanted with a P-type dopant or an N-type dopant as needed.

In some embodiments, a zeroth interlayer dielectric layer ILD0 is formed over the transistor 10, and a zeroth metal layer M0 is formed on the zeroth interlayer dielectric layer ILD0. In some embodiments, part of the zeroth metal layer M0 functions as a bit line BL. In some embodiments, the zeroth metal layer M0 is electrically coupled to the source/drain region 106 and 108 through zeroth via plugs V0.

In some embodiments, the zeroth interlayer dielectric layer ILD0 includes nitride such as silicon nitride, oxide such as silicon oxide, phosphosilicate glass (PSG), borosilicate glass (BSG), boron-doped phosphosilicate glass (BPSG), the like, or a combination thereof, and is formed by a suitable deposition technique such as spin-coating, chemical vapor deposition (CVD), flowable CVD, plasma-enhanced CVD (PECVD), atomic layer deposition (ALD), the like, or a combination thereof. In some embodiments, an etch stop layer is formed included in the zeroth interlayer dielectric layer ILD0, and the etch stop layer includes SiN, SiC or the like.

In some embodiments, each of the zeroth meta layer M0 and the zeroth via plugs V0 includes Al, Cu, AlCu, Au, Ti, TiN, Ta, TaN, W, WN or a combination thereof, and is formed by a suitable technique such as sputtering, electroless plating, electro plating, PVD, CVD, ALD, the like, or a combination thereof.

In some embodiments, a first interlayer dielectric layer ILD1 is formed over the zeroth interlayer dielectric layer ILD0, and a first metal layer M1 is formed on the first interlayer dielectric layer ILD1. In some embodiments, the first metal layer M1 is electrically coupled to the zeroth metal layer M0 (and therefore the source/drain region 106) through first via plugs V1. The materials and forming methods of the first interlayer dielectric layer ILD1, the first metal layer M1 and the first via plugs V1 are similar to those of the zeroth interlayer dielectric layer ILD0, the zeroth metal layer M0 and the zeroth via plugs V0 described above, so the details are not iterated herein.

In some embodiments, a second interlayer dielectric layer ILD2 is formed over the first interlayer dielectric layer ILD1, and a second metal layer M2 is formed on the second interlayer dielectric layer ILD2. In some embodiments, the second metal layer M2 is electrically coupled to the first metal layer M1 (and therefore the source/drain region 106) through second via plugs V2. The materials and forming methods of the second interlayer dielectric layer ILD2, the second metal layer M2 and the second via plugs V2 are similar to those of the zeroth interlayer dielectric layer ILD0, the zeroth metal layer M0 and the zeroth via plugs V0 described above, so the details are not iterated herein.

Referring to FIG. 1 and FIG. 2, a multi-bit memory cell 20 is disposed over the transistor 10. In some embodiments, the memory cell 20 is disposed on the second interlayer dielectric layer ILD2. In some embodiments, the memory cell 20 includes a bottom electrode BE electrically connected to one of the source/drain regions (e.g., the source/drain region 106), a top electrode TE disposed over the bottom electrode BE, and a first bit B1 and a second bit B2 separated from each other and disposed between the bottom electrode BE and the top electrode TE. In some embodiments, the first bit B1 and the second bit B2 are laterally disposed side by side. Specifically, each of the first B1 and the second bit B2 is in contact with the bottom electrode BE and the top electrode TE.

In some embodiments, part of the second metal layer M2 functions as a bottom electrode BE of the memory cell 20. In some embodiments, the top electrode TE includes Al, Cu, AlCu, Au, Ti, TiN, Ta, TaN, W, WN or a combination thereof, and is formed by a suitable technique such as sputtering, electroless plating, electro plating, PVD, CVD, ALD, the like, or a combination thereof. In some embodiments, the material of the top electrode TE may be the same as that of the bottom electrode BE. In other embodiments, the top electrode TE may have a material different from that of the bottom electrode BE. In some embodiments, the width of the top electrode TE is the same as the width of the bottom electrode TE, but the disclosure is not limited to. In other embodiments, the width of the top electrode TE is different from (e.g., greater than or smaller than) the width of the bottom electrode TE.

In some embodiments, each of the first bit B1 and the second bit B2 includes a magnetic tunnel junction (MTJ) stack or a storage element. In some embodiments, each of the first bit B1 and the second bit B2 is a spin torque transfer magnetic random access memory (STT-MRAM) bit. In some embodiments, as shown in FIG. 3, each of the first bit B1 and the second bit B2 includes, from bottom to top, a free layer 208, a tunnel barrier layer 210 and a reference layer 212.

The free layer 208 is disposed on the bottom electrode BE. The magnetization orientation of the free layer 208 may be switchable in the vertical axis, for example. The switchable magnetization orientation or magnetic anisotropy of the free layer 208 represents two states thereof with respect to the magnetization orientation of the reference layer 212, a parallel state or an antiparallel state. In the parallel state, the magnetic anisotropy of the free layer 208 is in the same direction as that of the reference layer 212, e.g., in the up direction. In the antiparallel state, the magnetic anisotropy of the free layer 208 is in a different direction from that of the reference layer 212, e.g., in the down direction. In some embodiments, the free layer 208 includes one or more of Fe, Co, Ni, FeCo, CoNi, CoFeB, FeB, FePt, FePd and a suitable ferromagnetic material. In some embodiments, the second free layer 208 includes CoFeB and has a thickness of about 10 nm to 25 nm.

The reference layer 212 is disposed on the free layer 208. The reference layer 212 has a fixed orientation or polarity, e.g., in the up direction, perpendicular to a substrate plane or a plane which the bit B1/B2 sits on. In some embodiments, the reference layer 212 includes one or more of Fe, Co, Ni, FeCo, CoNi, CoFeB, FeB, FePt, FePd and a suitable ferromagnetic material. In some embodiments, the reference layer 212 includes FeCo, CoFeB, FeB, the like, or a combination thereof. In some embodiments, the reference layer 212 includes CoFeB and has a thickness of about 10 nm to 25 nm.

The tunneling barrier layer 210 is disposed between the free layer 208 and the reference layer 212. The tunneling barrier layer 210 barriers the tunneling of charge carriers between the reference layer 212 and the free layer 208. In some embodiments, the tunneling barrier layer 210 includes an amorphous barrier, such as aluminum oxide ($AlO_x$) or titanium oxide ($TiO_x$), or a crystalline barrier, such as magnesium oxide (MgO) or a spinel (e.g., $MgAl_2O_4$). In some embodiments, the tunneling barrier layer 210 includes MgO and has a thickness of about 1 nm to 5 nm.

In some embodiments, each of the first bit B1 and the second bit B2 further includes a pinned layer 216 over the reference layer 212. The pinned layer 216 is configured to fix the orientation or magnetic anisotropy of the reference layer 212. In some embodiments, the pinned layer 216 is optional and is not a part of the bit B1/B2. In some embodiments, the pinned layer 216 has a fixed orientation or polarity, e.g., in the down direction, perpendicular to the substrate plane or the plane which the bit B1/B2 sits on. In some embodiments, the pinned layer 210 includes one or more of Fe, Co, Ni, FeCo, CoNi, CoFeB, FeB, FePt, FePd and a suitable ferromagnetic material. In some embodiments, the pinned layer 216 includes CoFeB and has a thickness of about 10 nm to 25 nm.

In some embodiments, the bit B1/B2 further includes a barrier layer 214 between the reference layer 212 and the pinned layer 216. In some embodiments, the barrier layer 214 includes one or more of W, Mo, Ru, Ir and a suitable material. In some embodiments, the barrier layer 214 includes Ru and has a thickness of about 1 nm.

Referring to FIG. 3, in some embodiments, the bit B1/B2 further includes a spin polarization layer 207 between the bottom electrode BE and the free layer 208. In some embodiments, the spin-polarized electron current of the spin polarization layer 207 eliminates the need for an external magnetic field to switch the free layer 208. In some embodiments, the spin polarization layer 207 is disposed over the bottom electrode BE and includes two layers configured to have magnetic anisotropies perpendicular to each other. For example, the spin polarization layer 207 includes a first spin polarization layer 204, a second spin polarization layer 206 and a buffer layer 205 disposed between the first spin polarization layer 204 and the second spin polarization layer 206. In some embodiments, the first spin polarization layer 204 has a fixed orientation or polarity, e.g., in the up direction, perpendicular to the substrate plane or the plane which the bit B1/B2 sits on. In some embodiments, the first spin polarization layer 204 includes Pt, CoFeB or a combination thereof and has a thickness of about 15 nm to 25 nm. The second spin polarization layer 206 is switchable in the horizontal axis, for example. In some embodiments, the second spin polarization layer 206 includes IrMn, PtMn or a combination thereof and has a thickness of about 15 nm to 25 nm. In some embodiments, the buffer layer 205 includes one or more of W, Mo, Ru, Ir and a suitable material. In some embodiments, the buffer layer 205 includes Ru and has a thickness of about 1 nm.

In the disclosure, the first bit B1 and the second bit B2 are formed with similar structures but different dimensions, so as to achieve multi-bit single cell function. In some embodiments, the first bit B1 and the second bit B2 are formed simultaneously. Such architecture is referred to as a one transistor-two magnetic tunnel junction per cell ("1T-2MTJ") architecture. In some embodiments, the dimension includes a width, a length, a height, a diameter, a cell size, a top-view area, a footprint area, the like, or a combination thereof.

In some embodiments, as shown in FIG. 1 and FIG. 2, the first width W1 of the first bit B1 is different (e.g., smaller than) the second width W2 of the second bit B2. In some embodiments, the ratio of the first width W1 of the first bit B1 to the second width W2 of the second bit B2 ranges from about 1:1.2 to 1:3, such as 1:1.5, 1:2 or 1:2.5, although other ratios may be possible. In some embodiments, the ratio of the top-view area of the first bit B1 to the top-view area of the second bit B2 ranges from about 1:1.5 to 1:4, such as 1:2, 1:2.5, 1:3 or 1:3.5, although other ratios may be possible. The first bit B1 is referred to as a "least significant bit (LSB)", and the second bit B2 is referred to as a "most significant bit (MSB)" in some examples.

Referring to FIG. 2 again, a third interlayer dielectric layer ILD3 is formed over the second interlayer dielectric layer ILD2, and a third metal layer M3 is formed on the third interlayer dielectric layer ILD3. In some embodiments, part of the third metal layer M3 functions as a source line SL. In some embodiments, the third metal layer M3 is electrically coupled to the second metal layer M2 (and therefore the source/drain region 106) through third via plugs V3. The materials and forming methods of the third interlayer dielectric layer ILD3, the third metal layer M3 and the third via plugs V3 are similar to those of the zeroth interlayer dielectric layer ILD0, the zeroth metal layer M0 and the zeroth via plugs V0 described above, so the details are not iterated herein. The memory device 1 of the disclosure is thus completed. The memory device 1 of the disclosure is a one transistor-two magnetic tunnel junction per cell ("1T-2MTJ") architecture.

In some embodiments, the memory device 1 includes a substrate 100, a transistor 10 and a memory cell 20. The memory cell 20 includes first and second bits B1 and B2 connected in parallel and disposed between the bottom electrode BE and the top electrode TE thereof. The first and second bits B1 and B2 of the memory cell 20 are electrically connected to the same source line SL, the same bit line BL and the same word line WL. The first and second bits B1 and B2 are provided with different sizes (and therefore different levels/states), so such memory cell 20 can be programed to have four states of 00, 01, 10, and 11.

Figure 4:
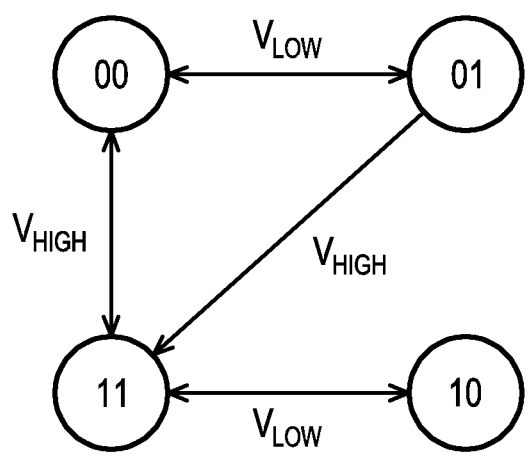
FIG. 4 is a schematic programming scheme of a memory device in accordance with some embodiments.

Such two-bit memory cell permits significantly increased data storage density in the same area of a chip without reducing memory cell size by storing four data in one memory cell. In order to program two bits of data in one cell, the bias voltages are adjusted to switch between four states/ levels of 00, 01, 10, and 11 of the cell. In some embodiments, the programming scheme of the memory device 1 is shown in FIG. 4.

The above embodiments in which two bits are laterally arranged side by side between top and bottom electrodes of the memory cell are provided for illustration purposes, and are not construed as limiting the present disclosure. In other embodiments, two bits may be vertically arranged between top and bottom electrodes of the memory cell.

Figure 5:
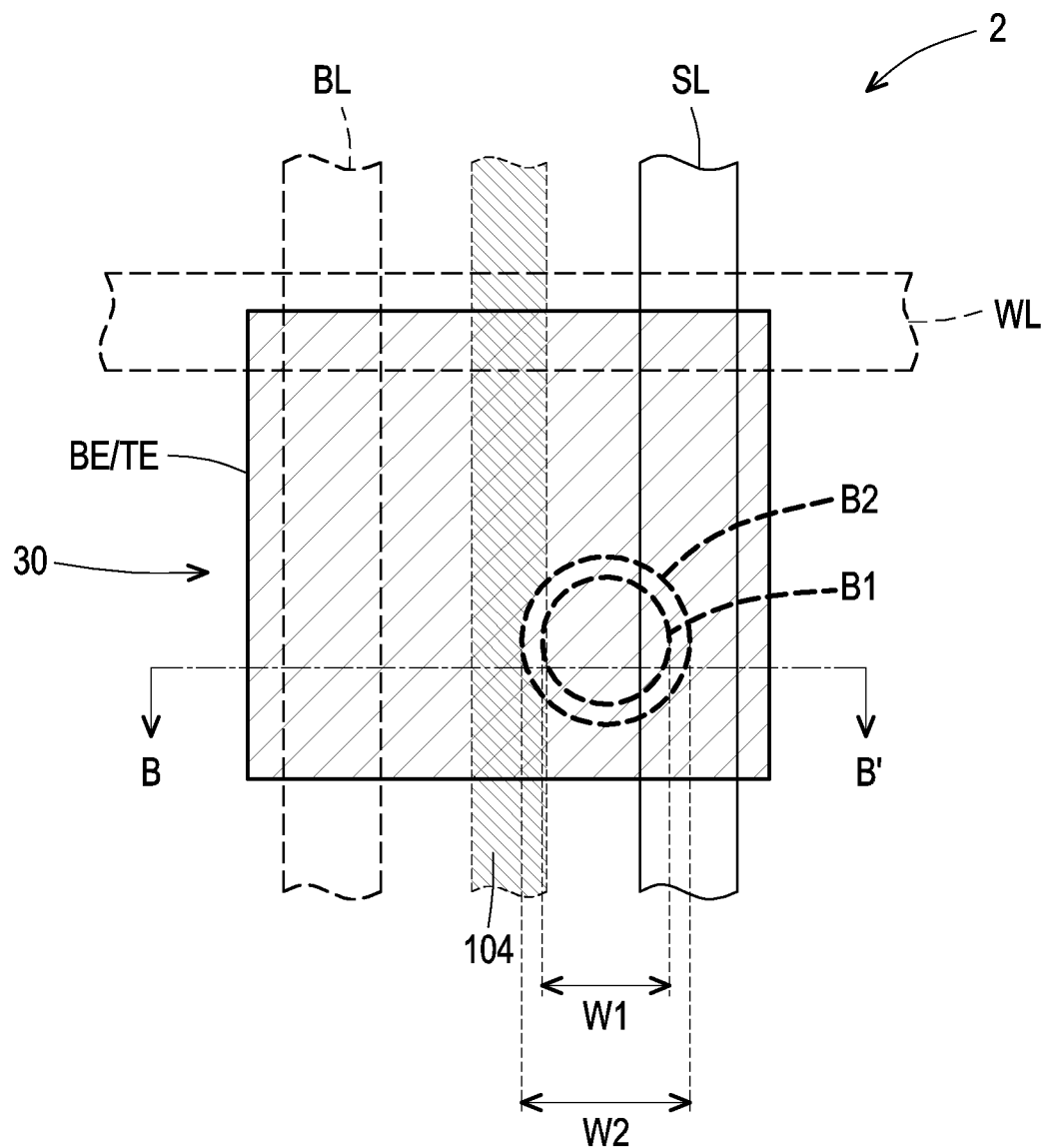
FIG. 5 is a schematic simplified top view of a memory device in accordance with some embodiments.
Figure 6:
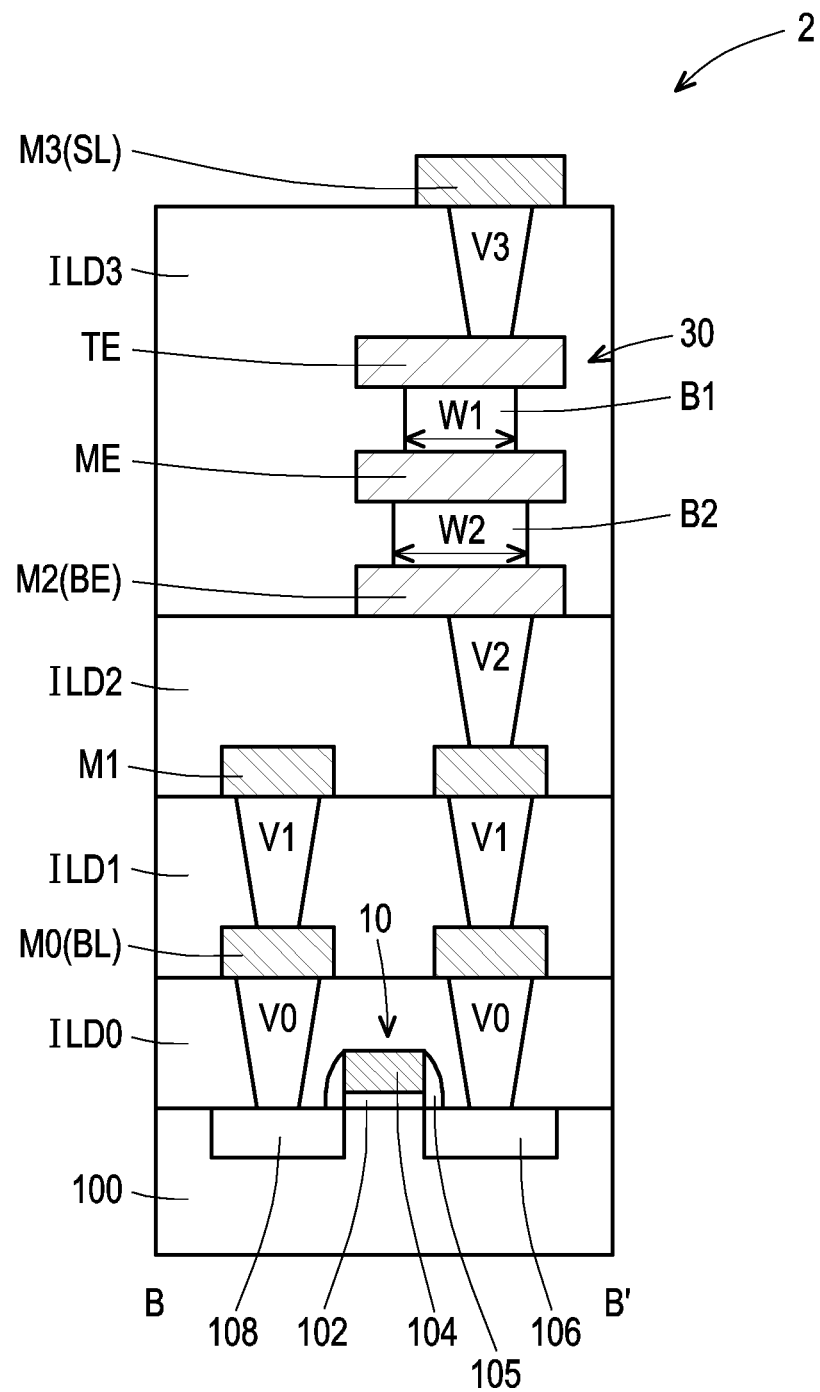
FIG. 6 is a schematic cross-sectional view taken along the line B-B' of FIG. 5.
Figure 7:
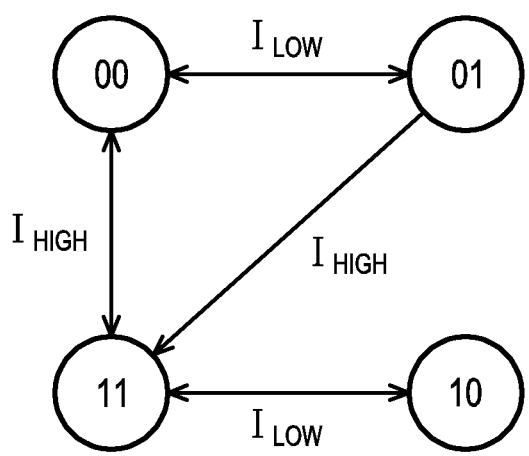
FIG. 7 is a schematic programming scheme of a memory device in accordance with some embodiments.

FIG. 5 is a schematic simplified top view of a memory device in accordance with some embodiments. FIG. 6 is a schematic cross-sectional view taken along the line B-B' of FIG. 5. FIG. 7 is a schematic programming scheme of a memory device in accordance with some embodiments. Similar features of the memory devices are labeled with similar numerical references and descriptions of the similar features are not repeated herein.

Referring to FIG. 5 and FIG. 6, a memory device 2 includes a transistor 10 and a memory cell 30. The memory cell 30 is a multi-bit memory cell (e.g., two-bit memory cell) controlled by a single transistor 10.

In some embodiments, the transistor 10 includes a gate dielectric layer 102, a gate electrode 104 over the gate dielectric layer 102, a spacer 105 aside the gate electrode 104, and two source/drain regions 106 and 108 in the substrate 100 beside the gate electrode 104.

In some embodiments, a zeroth interlayer dielectric layer ILD0 is formed over the transistor 10, and a zeroth metal layer M0 is formed on the zeroth interlayer dielectric layer ILD0. In some embodiments, part of the zeroth metal layer M0 functions as a bit line BL. In some embodiments, the zeroth metal layer M0 is electrically coupled to the source/drain region 106 and 108 through zeroth via plugs V0.

In some embodiments, a first interlayer dielectric layer ILD1 is formed over the zeroth interlayer dielectric layer ILD0, and a first metal layer M1 is formed on the first interlayer dielectric layer ILD1. In some embodiments, the first metal layer M1 is electrically coupled to the zeroth metal layer M0 (and therefore the source/drain region 106) through first via plugs V1.

In some embodiments, a second interlayer dielectric layer ILD2 is formed over the first interlayer dielectric layer ILD1, and a second metal layer M2 is formed on the second interlayer dielectric layer ILD2. In some embodiments, the second metal layer M2 is electrically coupled to the first metal layer M1 (and therefore the source/drain region 106) through second via plugs V2.

Referring to FIG. 5 and FIG. 6, a multi-bit memory cell 30 is disposed over the transistor 10. In some embodiments, the memory cell 30 is disposed on the second interlayer dielectric layer ILD2. In some embodiments, the memory cell 30 includes a bottom electrode BE electrically connected to one of the source/drain regions (e.g., the source/drain region 106), a top electrode TE disposed over the bottom electrode BE, and a first bit B1 and a second bit B2 separated from each other and disposed between the bottom electrode BE and the top electrode TE. In some embodiments, the first bit B1 and the second bit B2 are vertically stacked on each other, and a middle electrode ME is further provided between the first bit B1 and the second bit B2. Specifically, each of the first B1 and the second bit B2 is in contact with the middle electrode ME and one of the electrode BE and the top electrode TE.

In some embodiments, part of the second metal layer M2 functions as a bottom electrode BE of the memory cell 30. In some embodiments, the top electrode TE, the middle electrode ME and the top electrode may have the same material and/or dimension. In other embodiments, the top electrode TE, the middle electrode ME and the top electrode may have different materials and/or dimensions.

In some embodiments, each of the first bit B1 and the second bit B2 includes a magnetic tunnel junction (MTJ) stack or a storage element. In some embodiments, each of the first bit B1 and the second bit B2 is a spin torque transfer magnetic random access memory (STT-MRAM) bit. In some embodiments, each of the first bit B1 and the second bit B2 has a structure as shown in FIG. 3.

In the disclosure, the first bit B1 and the second bit B2 are formed with similar structures but different dimensions, so as to achieve multi-bit single cell function. In some embodiments, the first bit B1 and the second bit B2 are formed separately. The sequence of forming the first bit B1 and the second bit B2 is not limited by the disclosure. Such architecture is referred to as a one transistor-two magnetic tunnel junction per cell ("1T-2MTJ") architecture. In some embodiments, the dimension includes a width, a length, a height, a diameter, a cell size, a top-view area, a footprint area, the like, or a combination thereof.

In some embodiments, as shown in FIG. 5 and FIG. 6, the first width W1 of the first bit B1 is different (e.g., smaller than) the second width W2 of the second bit B2. In some embodiments, the ratio of the first width W1 of the first bit B1 to the second width W2 of the second bit B2 ranges from about 1:1.2 to 1:3, such as 1:1.5, 1:2 or 1:2.5, although other ratios may be possible. In some embodiments, the ratio of the top-view area of the first bit B1 to the top-view area of the second bit B2 ranges from about 1:1.5 to 1:4, such as 1:2, 1:2.5, 1:3 or 1:3.5, although other ratios may be possible. The first bit B1 is referred to as a "least significant bit (LSB)", and the second bit B2 is referred to as a "most significant bit (MSB)" in some examples.

Referring to FIG. 6 again, a third interlayer dielectric layer ILD3 is formed over the second interlayer dielectric layer ILD2, and a third metal layer M3 is formed on the third interlayer dielectric layer ILD3. In some embodiments, part of the third metal layer M3 functions as a source line SL. The memory device 2 of the disclosure is thus completed. The memory device 2 of the disclosure is a one transistor-two magnetic tunnel junction per cell ("1T-2MTJ") architecture.

In some embodiments, the memory device 2 includes a substrate 100, a transistor 10 and a memory cell 30. The memory cell 30 includes first and second bits B1 and B2 connected in series and disposed between the bottom electrode BE and the top electrode TE thereof. A middle electrode ME is further included and interposed between the first bit B1 and the second bit B2. The first and second bits B1 and B2 of the memory cell 20 are electrically connected to the same source line SL, the same bit line BL and the same word line WL. The first and second bits B1 and B2 are provided with different sizes (and therefore different levels/states), so such memory cell 30 can be programed to have four states of 00, 01, 10, and 11.

Such two-bit memory cell permits significantly increased data storage density in the same area of a chip without reducing memory cell size by storing four data in one memory cell. In order to program two bits of data in one cell, the bias currents are adjusted to switch between four states/levels of 00, 01, 10, and 11 of the cell. In some embodiments, the programming scheme of the memory device 2 is shown in FIG. 7.

The above embodiments in which one transistor-two magnetic tunnel junction per cell ("1T-2MTJ") architecture is provided for illustration purposes, and are not construed as limiting the present disclosure. The novel concept of the disclosure can be modified to form a memory device includes three or more memory bits controlled by one single transistor.

Figure 8:
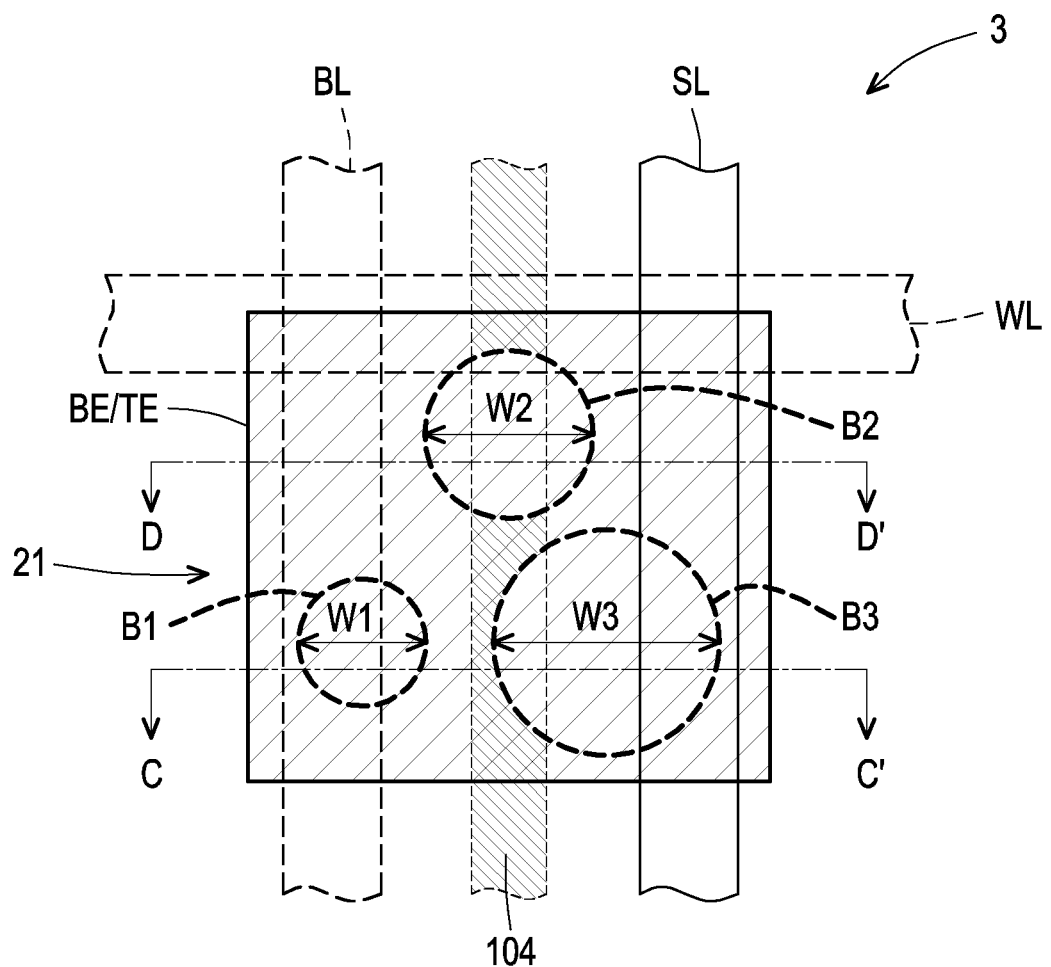
FIG. 8 is a schematic simplified top view of a memory device in accordance with some embodiments.
Figure 9:
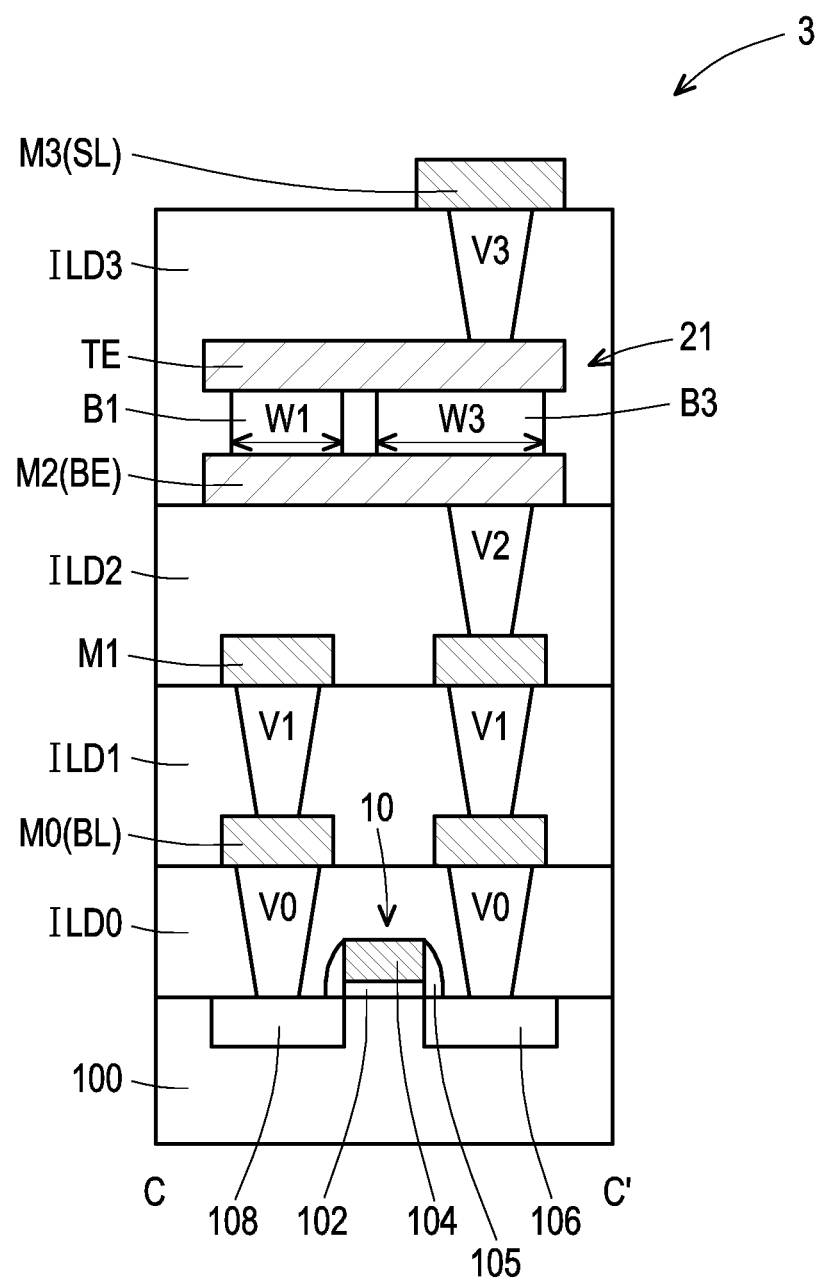
FIG. 9 is a schematic cross-sectional view taken along the line C-C' of FIG. 8.
Figure 10:
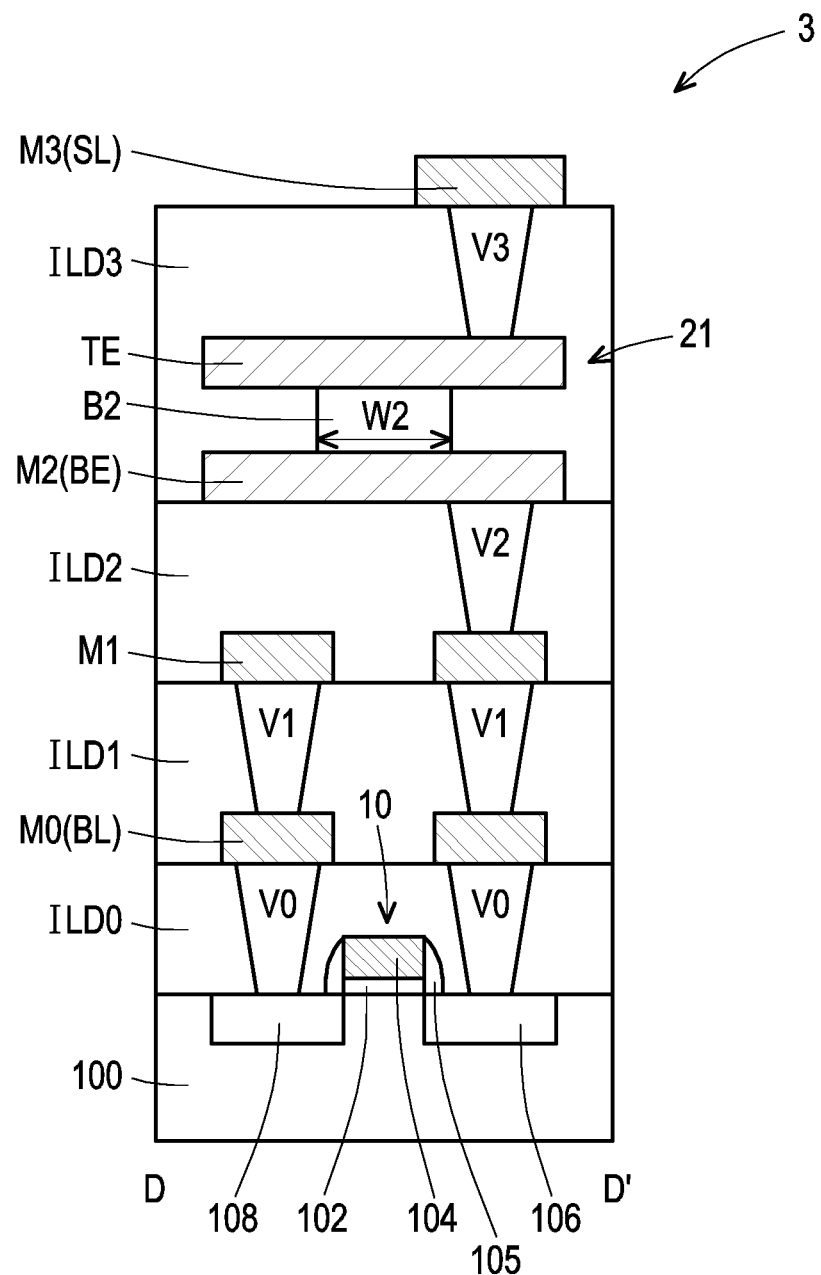
FIG. 10 is a schematic cross-sectional view taken along the line D-D' of FIG. 8.

FIG. 8 is a schematic simplified top view of a memory device in accordance with some embodiments. FIG. 9 is a schematic cross-sectional view taken along the line C-C' of FIG. 8. FIG. 10 is a schematic cross-sectional view taken along the line D-D' of FIG. 8.

The memory device 3 of FIG. 8 to FIG. 10 is similar to the memory device 1 of FIG. 1 to FIG. 3, and the difference between them is described below, and the similarity is not iterated herein.

In some embodiments, a memory device 3 includes a transistor 10 and a memory cell 21. The memory cell 21 is a multi-bit memory cell (e.g., three-bit memory cell) controlled by a single transistor 10.

Referring to FIG. 8 to FIG. 10, the multi-bit memory cell 21 is disposed over the transistor 10. In some embodiments, the memory cell 21 is disposed on the second interlayer dielectric layer ILD2. In some embodiments, the memory cell 21 includes a bottom electrode BE electrically connected to one of the source/drain regions (e.g., the source/drain region 106), a top electrode TE disposed over the bottom electrode BE, and a first bit B1, a second bit B2 and a third bit B3 separated from each other and disposed between the bottom electrode BE and the top electrode TE. In some embodiments, the first bit B1, the second bit B2 and the third bit B3 are laterally disposed side by side. Specifically, each of the first B1, the second bit B2 and the third bit B3 is in contact with the bottom electrode BE and the top electrode TE.

In some embodiments, each of the first bit B1, the second bit B2 and the third bit B3 includes a magnetic tunnel junction (MTJ) stack or a storage element. In some embodiments, each of the first bit B1, the second bit B2 and the third bit B3 is a spin torque transfer magnetic random access memory (STT-MRAM) bit. In some embodiments, each of the first bit B1, the second bit B2 and the third bit B3 has a structure as shown in FIG. 3.

In the disclosure, the first bit B1, the second bit B2 and the third bit B3 are formed with similar structures but different dimensions, so as to achieve multi-bit single cell function. In some embodiments, the first bit B1, the second bit B2 and the third bit B3 are formed simultaneously. Such architecture is referred to as a one transistor-three magnetic tunnel junction per cell ("1T-3MTJ") architecture. In some embodiments, the dimension includes a width, a length, a height, a diameter, a cell size, a top-view area, a footprint area, the like, or a combination thereof.

In some embodiments, as shown in FIG. 8 to FIG. 10, the first width W1 of the first bit B1 is different (e.g., smaller than) the second width W2 of the second bit B2, and the second width W2 of the second bit B2 is different (e.g., smaller than) the third width W3 of the second bit B3.

In some embodiments, the ratio of the first width W1 of the first bit B1, the second width W2 of the second bit B2 and the third width W3 of the third bit B3 ranges from about 1:1.2:1.5 to 1:2:3, such as 1:1.5:2, although other ratios may be possible. In some embodiments, the ratio of the top-view area of the first bit B1, the top-view area of the second bit B2 and the top-view area of the third bit B3 ranges from about 1:1.5:2 to 1:3:5, such as 1:2:4, although other ratios may be possible. The first bit B1 is referred to as a "least significant bit (LSB)", the second bit B2 is referred to as a "central significant bit (CSB)", and the third bit B3 is referred to as a "most significant bit (MSB)" in some examples.

Referring to FIG. 9 and FIG. 10 again, a third interlayer dielectric layer ILD3 is formed over the second interlayer dielectric layer ILD2, and a third metal layer M3 is formed on the third interlayer dielectric layer ILD3. In some embodiments, part of the third metal layer M3 functions as a source line SL. The memory device 3 of the disclosure is thus completed. The memory device 3 of the disclosure is a one transistor-three magnetic tunnel junction per cell ("1T-3MTJ") architecture.

In some embodiments, the memory device 3 includes a substrate 100, a transistor 10 and a memory cell 21. The memory cell 21 includes first to third bits B1, B2 and B3 connected in parallel and disposed between the bottom electrode BE and the top electrode TE thereof. The first to third bits B1, B2 and B3 of the memory cell 21 are electrically connected to the same source line SL, the same bit line BL and the same word line WL. The first to third bits B1, B2 and B3 are provided with different sizes (and therefore different levels/states), so such memory cell 21 can be programed to have eight states.

Such three-bit memory cell permits significantly increased data storage density in the same area of a chip without reducing memory cell size by storing eight data in one memory cell. In order to program three bits of data in one cell, the bias voltages are adjusted to switch between eight states/levels of the cell.

Figure 11:
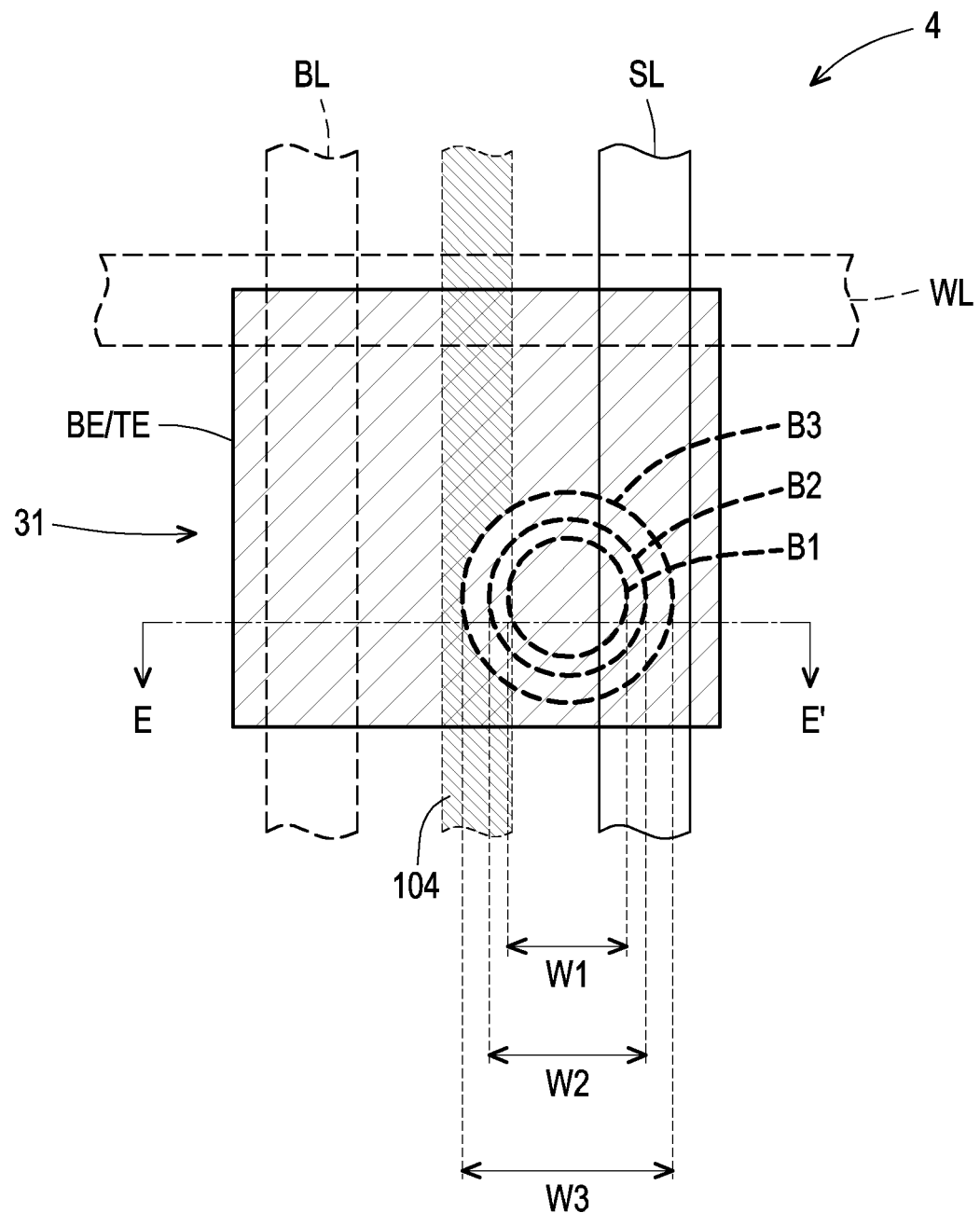
FIG. 11 is a schematic simplified top view of a memory device in accordance with some embodiments.
Figure 12:
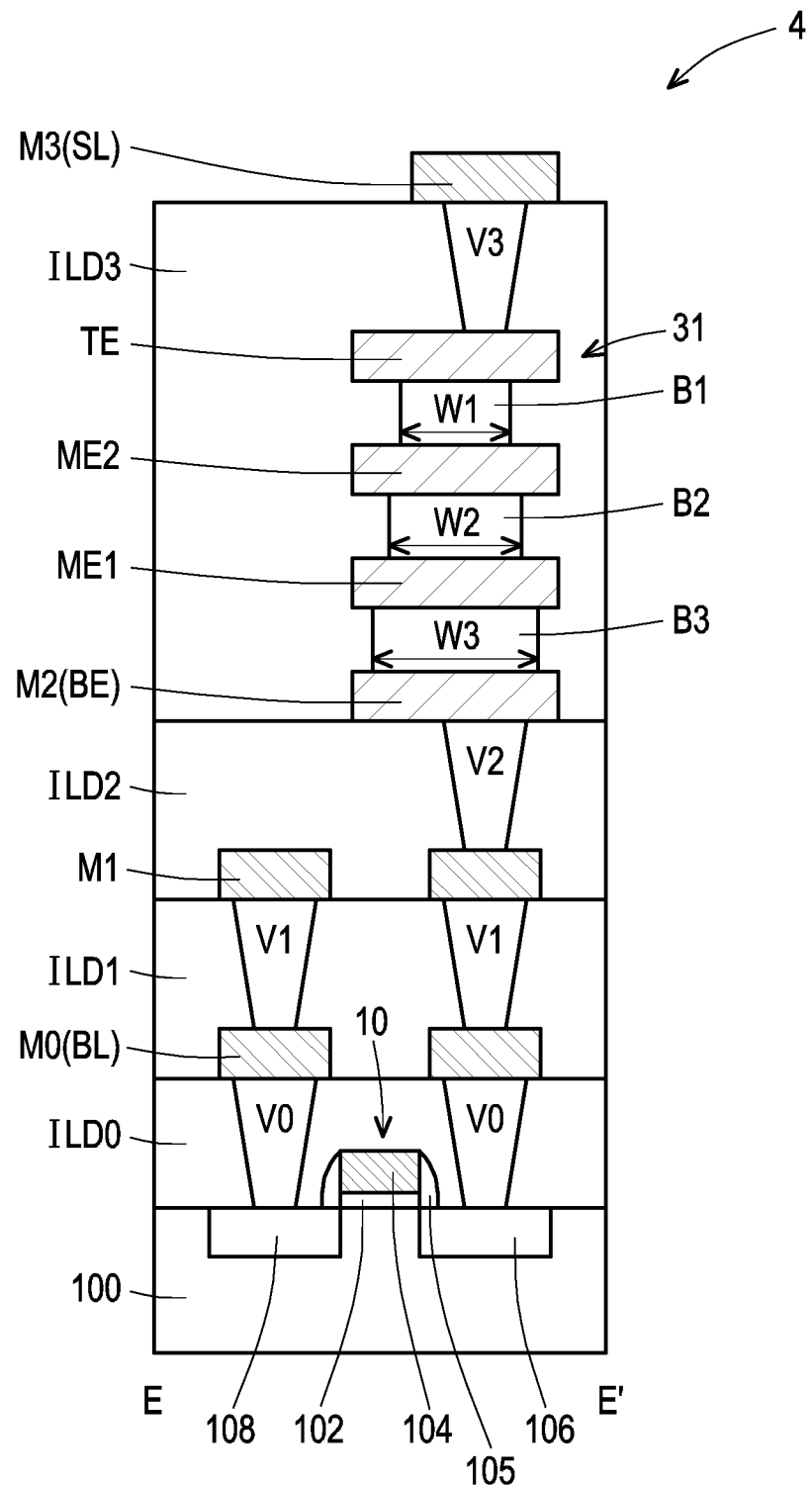
FIG. 12 is a schematic cross-sectional view taken along the line E-E' of FIG. 11.

FIG. 11 is a schematic simplified top view of a memory device in accordance with some embodiments. FIG. 12 is a schematic cross-sectional view taken along the line E-E' of FIG. 11.

The memory device 4 of FIG. 11 to FIG. 12 is similar to the memory device 2 of FIG. 5 to FIG. 6, and the difference between them is described below, and the similarity is not iterated herein.

In some embodiments, a memory device 4 includes a transistor 10 and a memory cell 31. The memory cell 31 is a multi-bit memory cell (e.g., three-bit memory cell) controlled by a single transistor 10.

Referring to FIG. 11 to FIG. 12, the multi-bit memory cell 31 is disposed over the transistor 10. In some embodiments, the memory cell 31 is disposed on the second interlayer dielectric layer ILD2. In some embodiments, the memory cell 31 includes a bottom electrode BE electrically connected to one of the source/drain regions (e.g., the source/drain region 106), a top electrode TE disposed over the bottom electrode BE, and a first bit B1, a second bit B2 and a third bit B3 separated from each other and disposed between the bottom electrode BE and the top electrode TE. In some embodiments, the first bit B1, the second bit B2 and the third bit B3 are vertically stacked on each other. In some embodiments, a middle electrode ME1 is further provided between the second bit B2 and the third bit B3, and a middle electrode ME2 is further provided between the first bit B1 and the second bit B2. Specifically, the first B1 is in contact with the middle electrode ME2 and the top electrode TE, the second bit B2 is in contact with the middle electrode ME1 and the middle electrode ME2, and the third bit B3 is in contact with the middle electrode ME1 and the bottom electrode BE.

In some embodiments, each of the first bit B1, the second bit B2 and the third bit B3 includes a magnetic tunnel junction (MTJ) stack or a storage element. In some embodiments, each of the first bit B1, the second bit B2 and the third bit B3 is a spin torque transfer magnetic random access memory (STT-MRAM) bit. In some embodiments, each of the first bit B1, the second bit B2 and the third bit B3 has a structure as shown in FIG. 3.

In the disclosure, the first bit B1, the second bit B2 and the third bit B3 are formed with similar structures but different dimensions, so as to achieve multi-bit single cell function. In some embodiments, the first bit B1, the second bit B2 and the third bit B3 are formed separately. The sequence of forming the first bit B1, the second bit B2 and the third bit B3 is not limited by the disclosure. In some embodiments, the dimensions of the first bit B1, the second bit B2 and the third bit B3 are gradually increased towards the bottom electrode BE, but the disclosure is not limited thereto. In other embodiments, the dimensions of the first bit B1, the second bit B2 and the third bit B3 are gradually decreased towards the bottom electrode BE.

Such architecture is referred to as a one transistor-three magnetic tunnel junction per cell ("1T-3MTJ") architecture. In some embodiments, the dimension includes a width, a length, a height, a diameter, a cell size, a top-view area, a footprint area, the like, or a combination thereof.

In some embodiments, as shown in FIG. 11 to FIG. 12, the first width W1 of the first bit B1 is different (e.g., smaller than) the second width W2 of the second bit B2, and the second width W2 of the second bit B2 is different (e.g., smaller than) the third width W3 of the second bit B3.

In some embodiments, the ratio of the first width W1 of the first bit B1, the second width W2 of the second bit B2 and the third width W3 of the third bit B3 ranges from about 1:1.2:1.5 to 1:2:3, such as 1:1.5:2, although other ratios may be possible. In some embodiments, the ratio of the top-view area of the first bit B1, the top-view area of the second bit B2 and the top-view area of the third bit B3 ranges from about 1:1.5:2 to 1:3:5, such as 1:2:4, although other ratios may be possible. The first bit B1 is referred to as a "least significant bit (LSB)", the second bit B2 is referred to as a "central significant bit (CSB)", and the third bit B3 is referred to as a "most significant bit (MSB)" in some examples.

Referring to FIG. 11 and FIG. 12 again, a third interlayer dielectric layer ILD3 is formed over the second interlayer dielectric layer ILD2, and a third metal layer M3 is formed on the third interlayer dielectric layer ILD3. In some embodiments, part of the third metal layer M3 functions as a source line SL. The memory device 4 of the disclosure is thus completed. The memory device 4 of the disclosure is a one transistor-three magnetic tunnel junction per cell ("1T-3MTJ") architecture.

In some embodiments, the memory device 4 includes a substrate 100, a transistor 10 and a memory cell 31. The memory cell 31 includes first to third bits B1, B2 and B3 connected in series and disposed between the bottom electrode BE and the top electrode TE thereof. The first to third bits B1, B2 and B3 of the memory cell 31 are electrically connected to the same source line SL, the same bit line BL and the same word line WL. The first to third bits B1, B2 and B3 are provided with different sizes (and therefore different levels/states), so such memory cell 31 can be programed to have eight states.

Such three-bit memory cell permits significantly increased data storage density in the same area of a chip without reducing memory cell size by storing eight data in one memory cell. In order to program three bits of data in one cell, the bias currents are adjusted to switch between eight states/levels of the cell.

In the above embodiments, the multi-bit memory cell 20/21/30/31 may be disposed within the third interlayer dielectric layer ILD3, and the multi-bit memory cell 20/21/30/31 may be electrically connected to respective first metal layer M1 and the third metal layer M3. However, the present disclosure is not limited to any particular location for the memory cell. For example, the multi-bit memory cell 20/21/30/31 may be disposed within any one of the ILD layers between two adjacent metallization layers of the interconnect structure.

Possible modifications and alterations can be made to the described memory devices. These modifications and alterations are provided for illustration purposes, and are not construed as limiting the present disclosure. For example, some of the multiple bits may be connected in serial, and some of the multiple bits may be connected in parallel.

Figure 13:
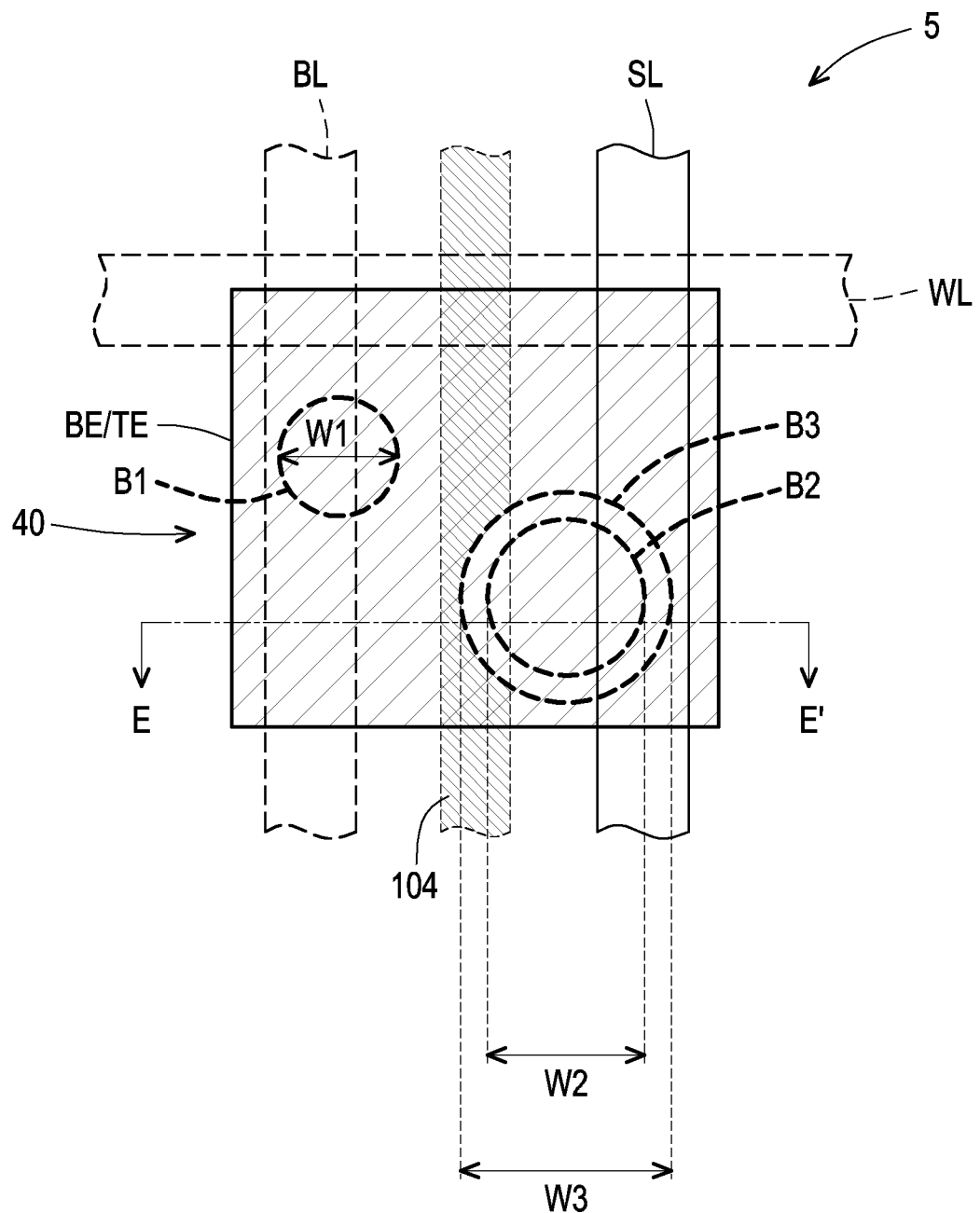
FIG. 13 is a schematic simplified top view of a memory device in accordance with some embodiments.

In some embodiments, as shown in FIG. 13, a memory device 5 includes a transistor 10 and a memory cell 40. The memory cell 40 is a multi-bit memory cell (e.g., three-bit memory cell) controlled by a single transistor 10. The memory cell 40 includes first to third bits B1, B2 and B3, in which the first bit B1 and the second bit B2 are connected in parallel, and the second bit B2 and the third bit B3 are connected in serial. Other possible configurations may be applicable.

The above embodiments in which two or three bits are included in one single cell are provided for illustration purposes, and are not construed as limiting the present disclosure. Four or more bits with different sizes may be included in one single cell, and these bits can be connected in parallel, connected in series, or some bits may be connected in serial while some bits may be connected in parallel.

In some embodiments, the dimensions of the multiple bits are varied in a regular manner, such as gradually varied towards one direction. In other embodiments, the dimensions of the multiple bits are varied in a random manner. In some embodiments, the multiple bits are distributed evenly within the transistor area (e.g., the area including the gate and source/drain regions). In other embodiments, the multiple bits are distributed locally within the transistor area (e.g., the area including the gate and source/drain regions).

Figure 14:
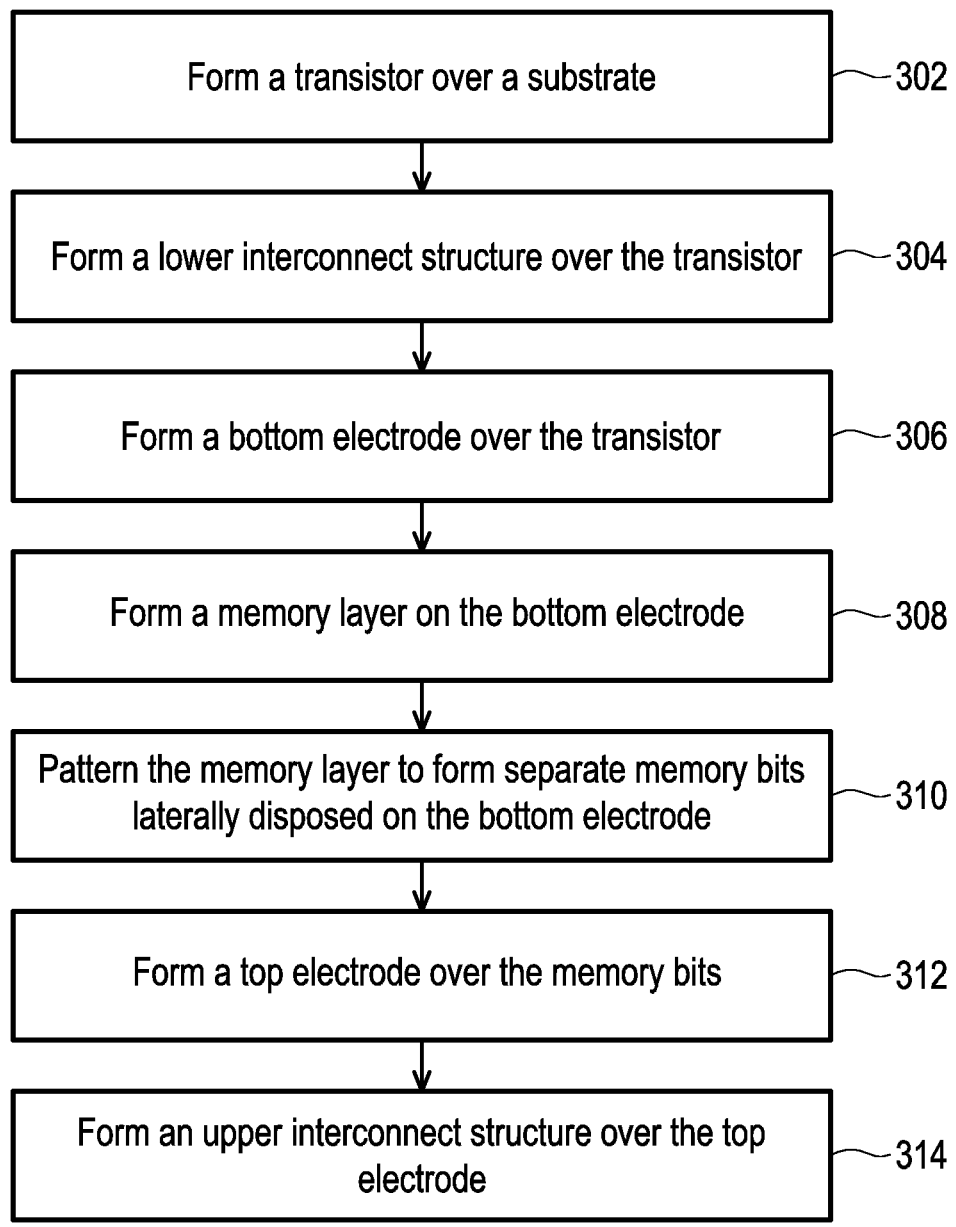
FIG. 14 illustrates a method of forming a memory device in accordance with some embodiments.

FIG. 14 illustrates a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, a transistor is formed over a substrate. At act 304, a lower interconnect structure is formed over the transistor. At act 306, a bottom electrode is formed over the transistor. At act 308, a memory layer is formed on the bottom electrode. At act 310, the memory layer is patterned to form separate memory bits laterally disposed on the bottom electrode. In some embodiments, the memory bits are formed with different sizes. At act 312, a top electrode is formed over the memory bits. At act 314, an upper interconnect structure is formed over the top electrode. FIG. 1 to FIG. 3 and FIG. 8 to FIG. 10 illustrate cross-sectional views and top views corresponding to some embodiments of act 302 to act 314.

Figure 15:
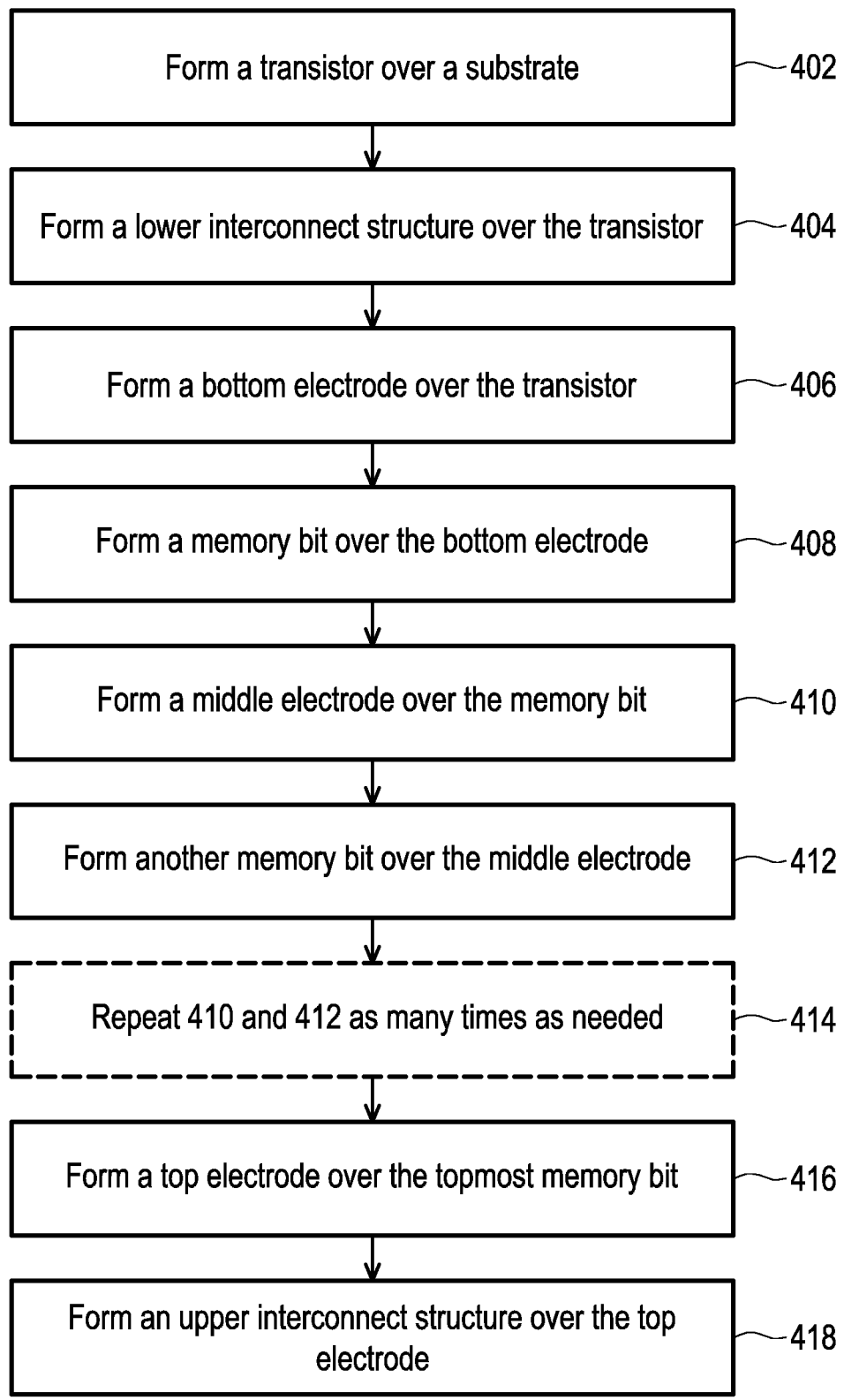
FIG. 15 illustrates a method of forming a memory device in accordance with some embodiments.

FIG. 15 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 402, a transistor is formed over a substrate. At act 404, a lower interconnect structure is formed over the transistor. At act 406, a bottom electrode is formed over the transistor. At act 408, a memory bit is formed over the bottom electrode. At act 410, a middle electrode is formed over the memory bit. At act 412, another memory bit is formed over the middle electrode. In some embodiments, the memory bit and the another memory bit are formed with different sizes. At act 414, act 410 and act 412 are repeated as many times as needed. The act 414 is optional and may be omitted as needed. At act 416, a top electrode is formed over the topmost memory bit. At act 418, an upper interconnect structure is formed over the top electrode. FIG. 5 to FIG. 6 and FIG. 11 to FIG. 12 illustrate cross-sectional views and top views corresponding to some embodiments of act 402 to act 418.

The multi-bit memory cell permits significantly increased data storage density in the same area of a chip without reducing memory cell size by storing two or more than two data in one memory cell. The multi-bit memory cell is programmed in multiple states by applying appropriate bias currents or bias voltages thereto. In some embodiments, the multi-bit memory cell is a MRAM cell, but the disclosure is not limited thereto. Other memory types may be applicable as long as the bits with different sizes between bottom and top electrodes can be programmed in multiple states by applying appropriate bias currents or bias voltages thereto. In other embodiments, the multi-bit memory cell is a phase-change random-access memory (PCRAM) cell.

In accordance with some embodiments of the present disclosure, a memory device includes a transistor and a memory cell. The transistor includes a gate electrode disposed over a substrate and source/drain regions in the substrate beside the gate electrode. The memory cell is disposed over the transistor and includes a bottom electrode electrically connected to one of the source/drain regions, a top electrode disposed over the bottom electrode, and a first bit and a second bit separated from each other and disposed between the bottom electrode and the top electrode.

In accordance with other embodiments of the present disclosure, a memory device includes a transistor, an interconnect structure and a memory cell. The transistor is disposed over the substrate. The interconnect structure is disposed over and electrically connected to the transistor. The memory cell is disposed between two adjacent metallization layers of the interconnect structure and includes multiple bits with different sizes controlled by the same transistor.

In accordance with yet other embodiments of the present disclosure, a method of forming a memory device includes forming a transistor over a substrate, forming a bottom electrode over the transistor, forming a memory layer on the bottom electrode, patterning the memory layer to form separate memory bits laterally disposed on the bottom electrode, and forming a top electrode over the memory bits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a transistor comprising a gate electrode disposed over a substrate and source/drain regions in the substrate beside the gate electrode; and
   a memory cell disposed over the transistor and comprising:
      a bottom electrode electrically connected to one of the source/drain regions;
      a top electrode disposed over the bottom electrode; and
      a first bit, a second bit and a third bit separated from each other and disposed between the bottom electrode and the top electrode, wherein the first bit and the second bit are vertically arranged, and the second bit and the third bit are horizontally arranged, and wherein from a top view, the first bit, the second bit and the third bit are within a boundary of each of the bottom electrode and the top electrode.

2. The memory device of claim 1, wherein the first bit and the second bit have different dimensions.

3. The memory device of claim 1, wherein one of the first bit and the second bit is in direct contact to the bottom electrode.

4. The memory device of claim 1, wherein one of the first bit and the second bit is in direct contact to the top electrode.

5. The memory device of claim 1, further comprising a middle electrode between the first bit and the second bit.

6. The memory device of claim 1, wherein a ratio of a first width of the first bit to a second width of the second bit ranges from 1:1.2 to 1:3.

7. The memory device of claim 1, wherein the memory cell is a MRAM cell.

8. The memory device of claim 1, wherein the memory cell comprises, from bottom to top, a spin polarization layer, a free layer, a tunnel barrier layer and a reference layer.

9. The memory device of claim 1, wherein the second bit and the third bit have different dimensions.

10. The memory device of claim 1, wherein from the top view, at least one of the first bit and the second bit is overlapped with the gate electrode.

11. The memory device of claim 1, wherein the first bit, the second bit and the third bit have different top-view areas.

12. A memory device, comprising:
    a transistor disposed over a substrate;
    an interconnect structure disposed over and electrically connected to the transistor; and
    a memory cell disposed between two adjacent metallization layers of the interconnect structure and comprising multiple bits with different sizes controlled by the transistor, wherein the memory cell further comprises a bottom electrode and a top electrode, some of the multiple bits are vertically stacked between the bottom electrode and the top electrode, and/or some of the multiple bits are horizontally arranged between the bottom electrode and the top electrode, and wherein from a top view, the multiple bits are within a boundary of each of the bottom electrode and the top electrode.

13. The memory device of claim 12, wherein some of the multiple bits are connected in parallel, and some of the multiple bits are connected in series.

14. The memory device of claim 12, wherein from the top view, at least one of the multiple bits is overlapped with a gate electrode of the transistor.

15. The memory device of claim 12, wherein dimensions of the multiple bits are gradually varied towards one direction.

16. The memory device of claim 12, wherein the multiple bits are electrically connected to a source line.

17. The memory device of claim 12, wherein the memory cell is a MRAM cell.

18. A memory device, comprising:
a transistor; and
a memory cell, disposed over and electrically connected to the transistor, and comprising a first bit, a second bit and a third bit, wherein the first bit and the second bit are connected in parallel, and the second bit and the third bit are connected in serial,
wherein the memory cell further comprises a bottom electrode and a top electrode, and the first bit, the second bit and the third bit are disposed between the bottom electrode and the top electrode, and wherein from a top view, the first bit, the second bit and the third bit are within a boundary of each of the bottom electrode and the top electrode.

19. The memory device of claim 18, wherein the memory cell is a MRAM cell.

20. The memory device of claim 18, wherein the first bit, the second bit and the third bit have different top-view areas.

* * * * *